(12) United States Patent
Chen et al.

(10) Patent No.: US 9,287,153 B2
(45) Date of Patent: Mar. 15, 2016

(54) SEMICONDUCTOR BAKING APPARATUS AND OPERATION METHOD THEREOF

(71) Applicant: TAIWAN SEMICONDUCTOR MANUFACTURING CO., LTD., Hsinchu (TW)

(72) Inventors: Hsin-Kai Chen, Dounan Township (TW); Hung-Chih Wang, Hsinchu (TW); Hon-Lin Huang, Hsinchu (TW); Shih-Chi Lin, HsinChu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/461,035

(22) Filed: Aug. 15, 2014

(65) Prior Publication Data

US 2016/0049321 A1 Feb. 18, 2016

(51) Int. Cl.
*B05D 3/06* (2006.01)
*H01L 21/677* (2006.01)
*H01L 21/67* (2006.01)
*C30B 25/10* (2006.01)

(52) U.S. Cl.
CPC .... *H01L 21/67748* (2013.01); *H01L 21/67115* (2013.01); *C30B 25/105* (2013.01)

(58) Field of Classification Search
None
See application file for complete search history.

(56) References Cited

U.S. PATENT DOCUMENTS

| 5,292,393 A * | 3/1994 | Maydan | H01L 21/67201 118/715 |
| 2011/0033636 A1 * | 2/2011 | Nishimura | H01J 37/32192 427/557 |
| 2011/0100955 A1 * | 5/2011 | Pushparaj | B82Y 10/00 216/37 |
| 2015/0107988 A1 * | 4/2015 | Yamazaki | H01L 21/02554 204/192.25 |

* cited by examiner

*Primary Examiner* — Angel Roman
(74) *Attorney, Agent, or Firm* — Maschoff Brennan

(57) ABSTRACT

A semiconductor baking apparatus includes a load lock chamber, a process chamber, a transfer chamber, a first interior door, and a controller. The process chamber has a first accommodating space therein. The transfer chamber has a second accommodating space therein, and the transfer chamber is connected to the load lock chamber and the process chamber. The first interior door is between the process chamber and the transfer chamber. When the first interior door is opened, the first accommodating space is communicated with the second accommodating space. The controller is programmed to open the first interior door when the semiconductor baking apparatus idles.

20 Claims, 16 Drawing Sheets

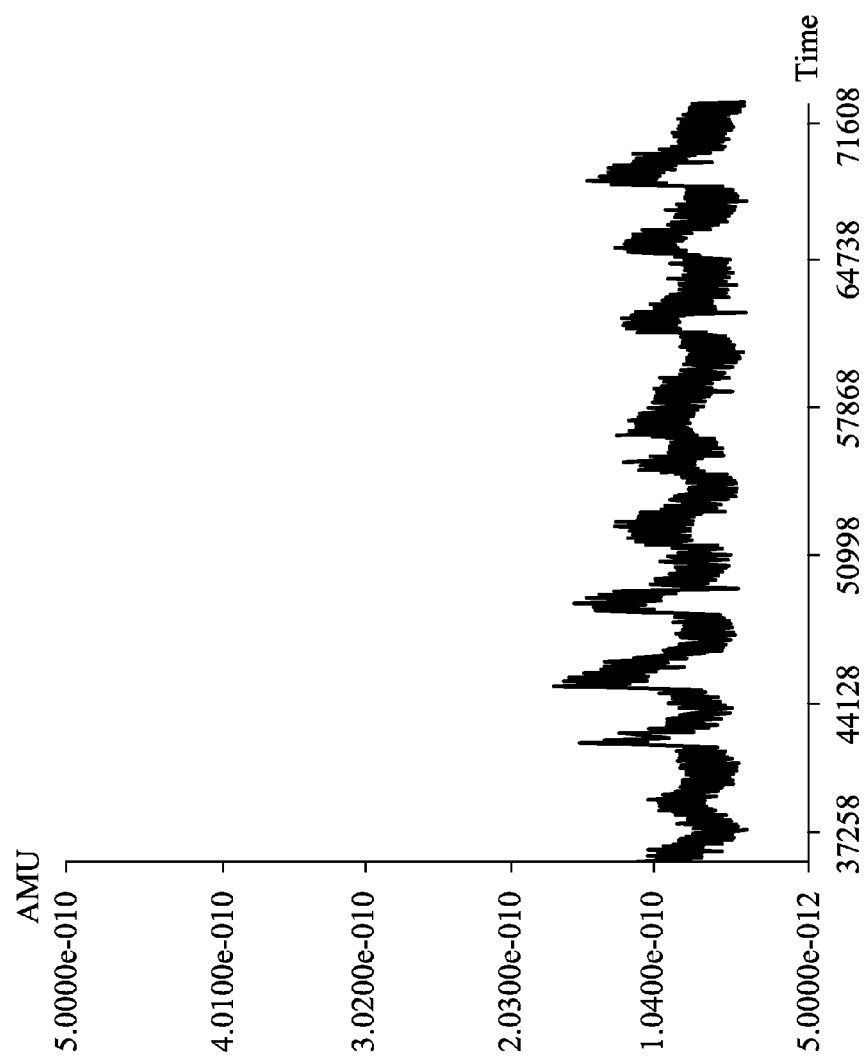

SEMICONDUCTOR BAKING APPARATUS AND OPERATION METHOD THEREOF

BACKGROUND

The present disclosure relates to semiconductor baking apparatuses. When a photolithography process is performed on a film of a semiconductor wafer, the photolithography process may have bubble defects and a long cycle time if the film is not smooth. Specifically, if the film is not smooth, organic particles and/or steam may be attached onto the film. If the organic particles and/or the steam are attached onto the film before the photolithography process, the bubble defects will be formed on the wafer after the photolithography process. The bubble defects left on the wafer may cause breakdown or shortage problems of the circuits formed on the wafer. Therefore, the photoresist film may be formed on the film for a longer coating time to decrease the bubble defects. As a result, the cycle time of the photolithography process is increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13A is an $O_2$ AMU-Time relationship chart in a load lock chamber and a transfer chamber shown in FIG. 10;

DETAILED DESCRIPTION

Figure 1:
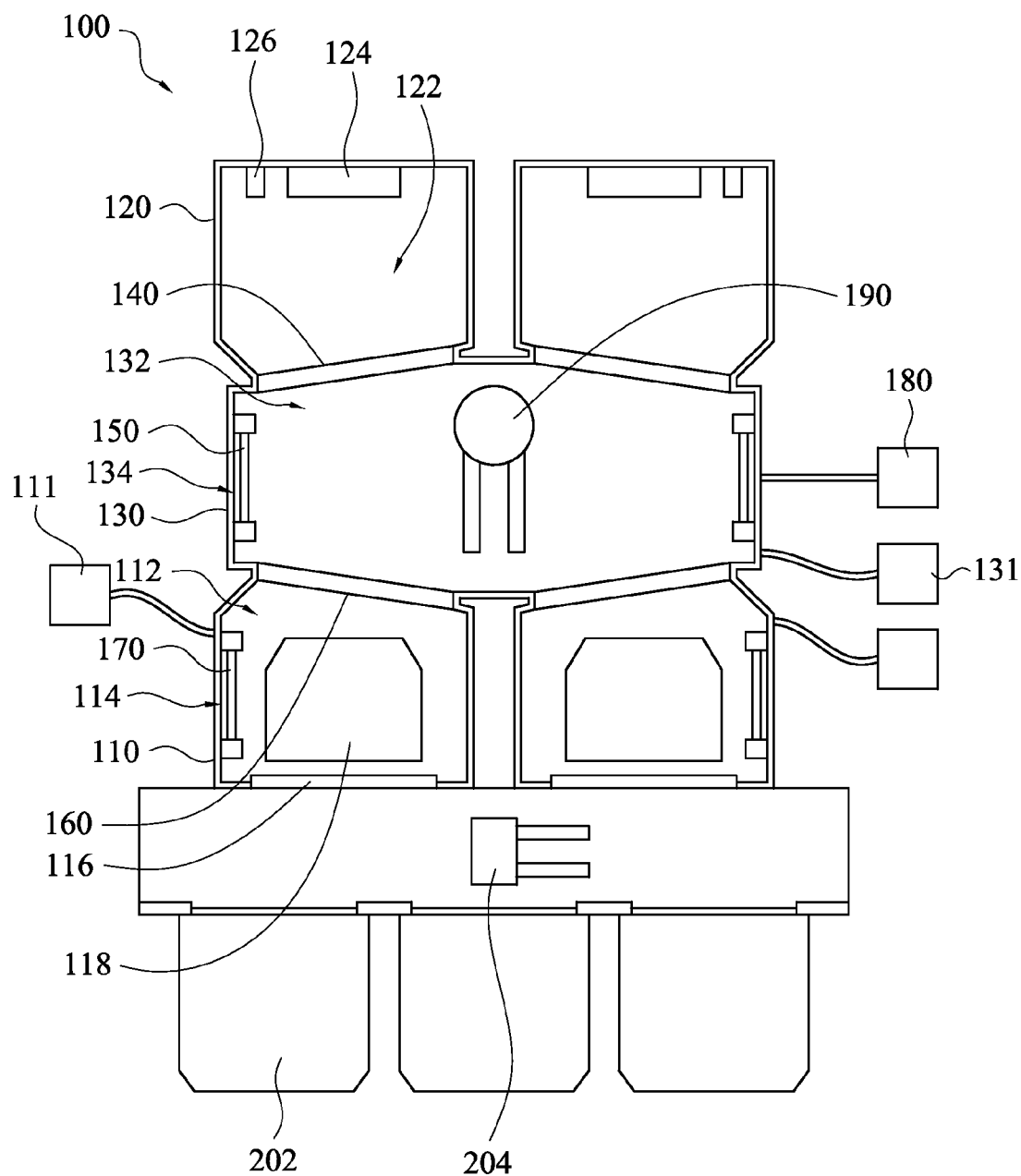
FIG. 1 is a schematic view of a semiconductor baking apparatus according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

During a BEOL (back end of line) process of a semiconductor wafer, a baking apparatus can be used to bake a film, such as a metal or oxide film of the wafer. After the film of the wafer is baked by the baking apparatus, the surface of the film becomes smoother. However, the bubble defects may still exist. This is because organic particles (e.g., organic carbon) and/or steam tend to be attached onto low temperature regions. Therefore, if the baking apparatus have some low temperature regions, the organic particles and/or the steam can not be easily removed from the low temperature regions. Once the organic particles and/or the steam in the low temperature regions are attached onto the film, after photoresist is coated onto the film, the organic particles and/or the steam on the film will be covered by the photoresist so as to form the bubble defects.

FIG. 1 is a schematic view of a semiconductor baking apparatus 100 according to some embodiments of the present disclosure. An external robot 204 is movably disposed between the semiconductor baking apparatus 100 and a cassette port 202. The semiconductor baking apparatus 100 includes a load lock chamber 110, a process chamber 120, a transfer chamber 130, a first interior door 140, and a controller 180. The process chamber 120 has a first accommodating space 122 therein to bake a wafer. The transfer chamber 130 has a second accommodating space 132 therein and is connected to the load lock chamber 110 and the process chamber 120. The first interior door 140 is between the process chamber 120 and the transfer chamber 130. When the first interior door 140 is opened, the first accommodating space 122 is communicated with the second accommodating space 132. The controller 180 is programmed to open the first interior door 140 when the semiconductor baking apparatus 100 idles or, to be specific, after the current wafer lot is moved out of the semiconductor baking apparatus 100 and before the next wafer lot is moved into the semiconductor baking apparatus 100.

When the semiconductor baking apparatus 100 idles, the temperature inside the process chamber 120 is higher than the temperature inside the transfer chamber 130 if the first interior door 140 is not opened. Therefore, in some embodiments, when the semiconductor baking apparatus 100 idles, the first interior door 140 is opened to allow heat to transfer from the process chamber 120 to the transfer chamber 130, thereby raising the temperature inside the transfer chamber 130. Since the temperature inside the transfer chamber 130 is raised, organic particles (e.g., organic carbon) and/or steam (e.g., $H_2O$) in the transfer chamber 130 are decreased. When the next wafer is moved in the transfer chamber 130, there will be fewer organic particles and/or steam attached onto the next wafer, thereby decreasing bubble defects occurring after the later photolithography process.

Moreover, the semiconductor baking apparatus 100 includes a transfer chamber pump 131. Before the first interior door 140 is opened, the transfer chamber pump 131 is operable to pump down a transfer chamber base pressure inside the transfer chamber 130 when the semiconductor baking apparatus 100 idles, such that the transfer chamber base pressure inside the transfer chamber 130 may be the same as a process chamber base pressure inside the process chamber 120.

The transfer chamber 130 includes a transfer robot 190 disposed in the second accommodating space 132. The transfer robot 190 is used to move a wafer from the load lock chamber 110 to the process chamber 120 or from the process chamber 120 to the load lock chamber 110. When the wafer is in the process chamber 120, the process chamber 120 performs a baking process to the wafer to smooth the surface of the film of the wafer. After the baking process is finished, the wafer is moved from the process chamber 120 to the load lock chamber 110 through the transfer chamber 130, and thereafter the wafer is moved from the load lock chamber 110 to a wafer cassette that is on the cassette port 202 by the external robot 204. When the wafer is removed from the load lock chamber 110, the first interior door 140 may be opened, such that the first accommodating space 122 is communicated with the second accommodating space 132.

In some embodiments, the semiconductor baking apparatus 100 further includes a first heating lamp 150. The first heating lamp 150 is disposed in the second accommodating space 132 of the transfer chamber 130. The controller 180 is programmed to turn on the first heating lamp 150 when the semiconductor baking apparatus 100 idles. The first heating lamp 150 disposed in the second accommodating space 132 may further increase the temperature inside the transfer chamber 130. Therefore, the temperature difference and the heat gradient between the first and second accommodating spaces 122, 132 may be reduced. For example, the first heating lamp 150 may keep the temperature inside the transfer chamber 130 more than 150° C., such that the organic particles and/or steam in the transfer chamber 130 are further decreased.

In some embodiments, the load lock chamber 110 has a third accommodating space 112 therein and an exterior door 116. The semiconductor baking apparatus 100 further includes a second interior door 160. The second interior door 160 is between the load lock chamber 110 and the transfer chamber 130, and the exterior door 116 is opposite the second interior door 160. After the last wafer is removed from the load lock chamber 110 through the exterior door 116, the first and second interior doors 140, 160 may be opened, such that the first accommodating space 122 is communicated with the second accommodating space 132, and the third accommodating space 112 is communicated with the second accommodating space 132. When the semiconductor baking apparatus 100 idles, the first and second interior door 140, 160 are opened to allow the heat to transfer from the process chamber 120 to the load lock chamber 110 through the transfer chamber 130, thereby raising the temperature inside the load lock chamber 110. The controller 180 is programmed to open the second interior door 160 when the semiconductor baking apparatus 100 idles. Since the temperature inside the load lock chamber 110 is raised, organic particles and/or steam in the load lock chamber 110 are decreased. When the next wafer is moved in the load lock chamber 110, there will be fewer organic particles and/or steam attached onto the next wafer, thereby decreasing bubble defects occurring after the later photolithography process.

Moreover, the semiconductor baking apparatus 100 may further includes a load lock chamber pump 111. Before the second interior door 160 is opened, the load lock chamber pump 111 is operable to pump down a load lock chamber base pressure inside the load lock chamber 110 when the semiconductor baking apparatus 100 idles, such that the load lock chamber base pressure inside the load lock chamber 110 may be the same as the transfer chamber base pressure inside the transfer chamber 130.

In some embodiments, the semiconductor baking apparatus 100 further includes a second heating lamp 170. The second heating lamp 170 is disposed in the third accommodating space 112 of the load lock chamber 110. The controller 180 is programmed to turn on the second heating lamp 170 when the semiconductor baking apparatus 100 idles. The second heating lamp 170 disposed in the third accommodating space 112 may further increase the temperature inside the load lock chamber 110. Therefore, the temperature difference and the heat gradient between the first and third accommodating spaces 122, 112 may be reduced. For example, the second heating lamp 170 may keep the temperature inside the load lock chamber 110 more than 150° C., such that the organic particles and/or steam in the load lock chamber 110 are further decreased.

In addition, the transfer chamber 130 has a sidewall 134 adjacent to the first and second interior doors 140, 160, and the first heating lamp 150 may be disposed on the sidewall 134. The load lock chamber 110 has a sidewall 114 adjacent to the exterior door 116 and the second interior door 160, and the second heating lamp 170 may be disposed on the sidewall 114.

In some embodiments, the process chamber 120 includes a heater 124 and a gas inlet 126. The heater 124 disposed in the first accommodating space 122, and the gas inlet 126 is communicated with the first accommodating space 122. The heater 124 is used to bake a wafer during a baking process and maintain a high temperature inside the process chamber 120 (e.g., more than 300° C.). When the semiconductor baking apparatus 100 idles, the first interior door 140 is opened, and a gas flow (e.g., $N_2$ flow) may flow out the gas inlet 126, such that the gas flow flows from the first accommodating space 122 to the second accommodating space 132. The gas flow may bring the heat generated by the heater 124 to the second accommodating space 132 of the transfer chamber 130. As a result, the uniformity of the temperature inside the transfer chamber 130 is improved. When a wafer is in the transfer chamber 130, the temperature of the metal or oxide film of the wafer is uniform, such that the organic particles and/or the steam are not easily attached onto the metal or oxide film of the wafer. After the later photolithography process, bubble defects formed on the metal or oxide film of the wafer will be decreased.

In some embodiments, when the semiconductor baking apparatus 100 idles, the first and second interior doors 140, 160 are opened, and the gas flow flows from the first accommodating space 122 to the third accommodating space 112 through the second accommodating space 132. As a result, the uniformity of the temperature inside the load lock chamber 110 is improved. When a wafer is in the load lock chamber 110, the temperature of the metal or oxide film of the wafer is uniform, such that the organic particles and/or the steam are not easily attached onto the metal or oxide film of the wafer. After the later photolithography process, bubble defects formed on the metal or oxide film of the wafer will be decreased.

It is to be noted that the connection relationships of the elements described above will not be repeated in the following description, and only aspects related to operation methods of the semiconductor baking apparatus 100 will be described.

Figure 2:
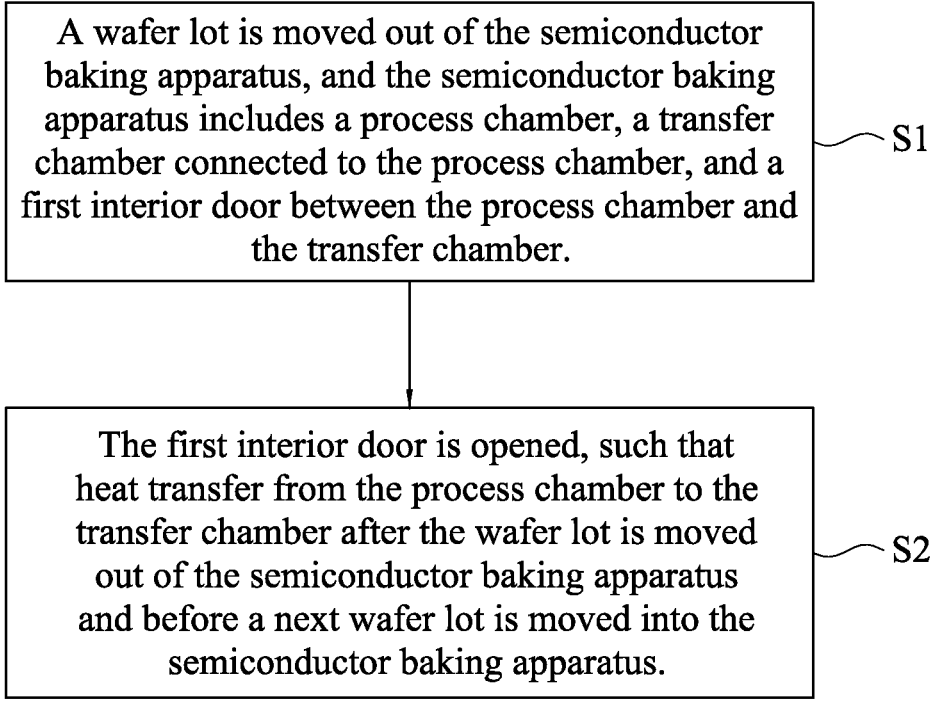
FIG. 2 is a flow chart of an operation method of a semiconductor baking apparatus according to some embodiments of the present disclosure.

FIG. 2 is a flow chart of an operation method of a semiconductor baking apparatus according to some embodiments of the present disclosure. The operation method of the semiconductor baking apparatus includes the following steps. In step Sl, a wafer lot is moved out of the semiconductor baking apparatus, and the semiconductor baking apparatus includes a process chamber, a transfer chamber connected to the process chamber, and a first interior door between the process chamber and the transfer chamber. Thereafter in step S2, the first interior door is opened, such that heat transfers from the process chamber to the transfer chamber after the wafer lot is moved out of the semiconductor baking apparatus and before a next wafer lot is moved into the semiconductor baking apparatus.

The aforesaid wafer lot may include a plurality of wafers. The last wafer described in the following description is referred to as a wafer of the wafer lot that is the last one to be moved out the process chamber of the semiconductor baking apparatus. In the following description, the aforementioned steps will be described in detail.

Figure 3:
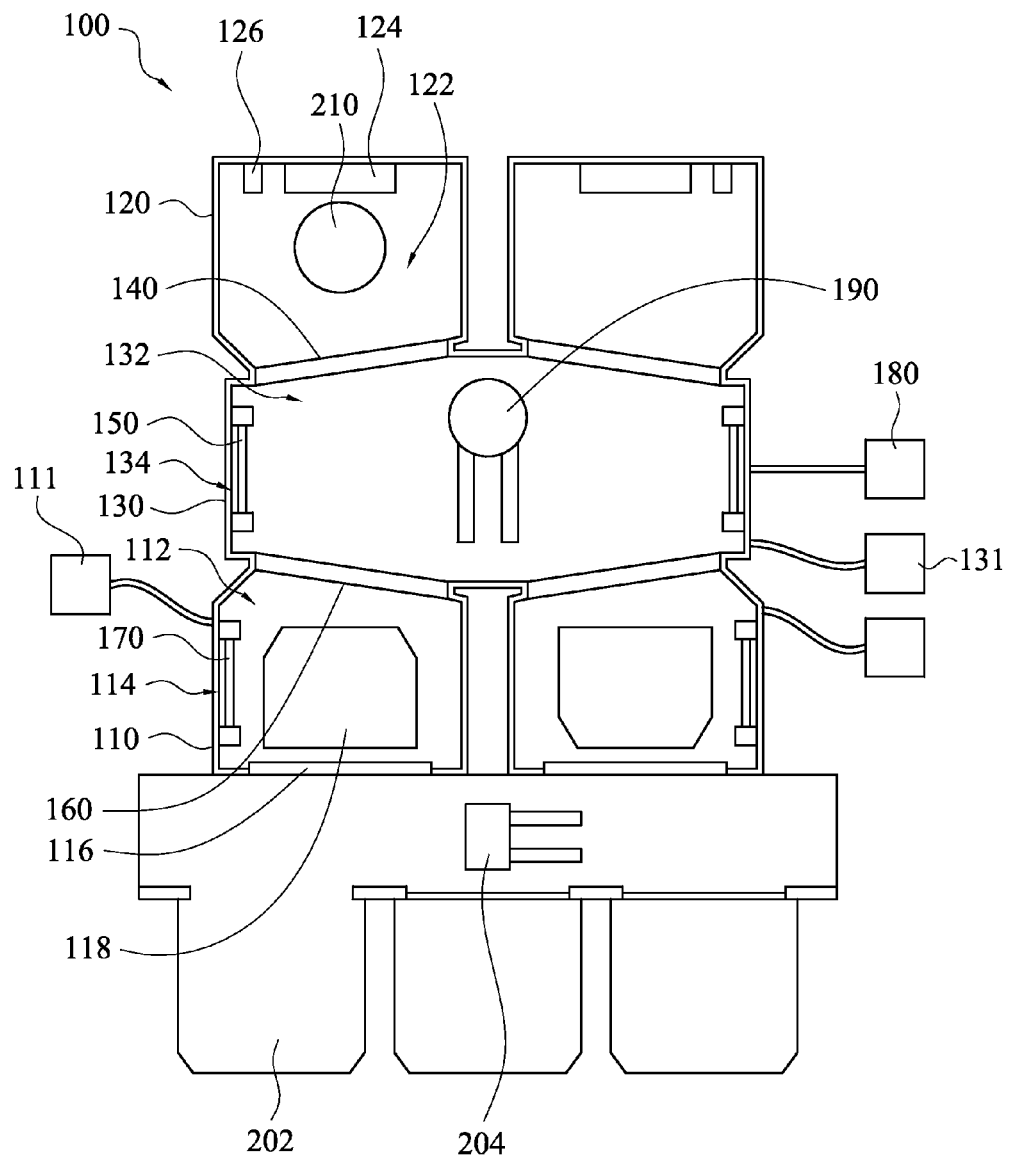
FIG. 3 is a schematic view of a last wafer backed in a process chamber show in FIG. 1.
Figure 4:
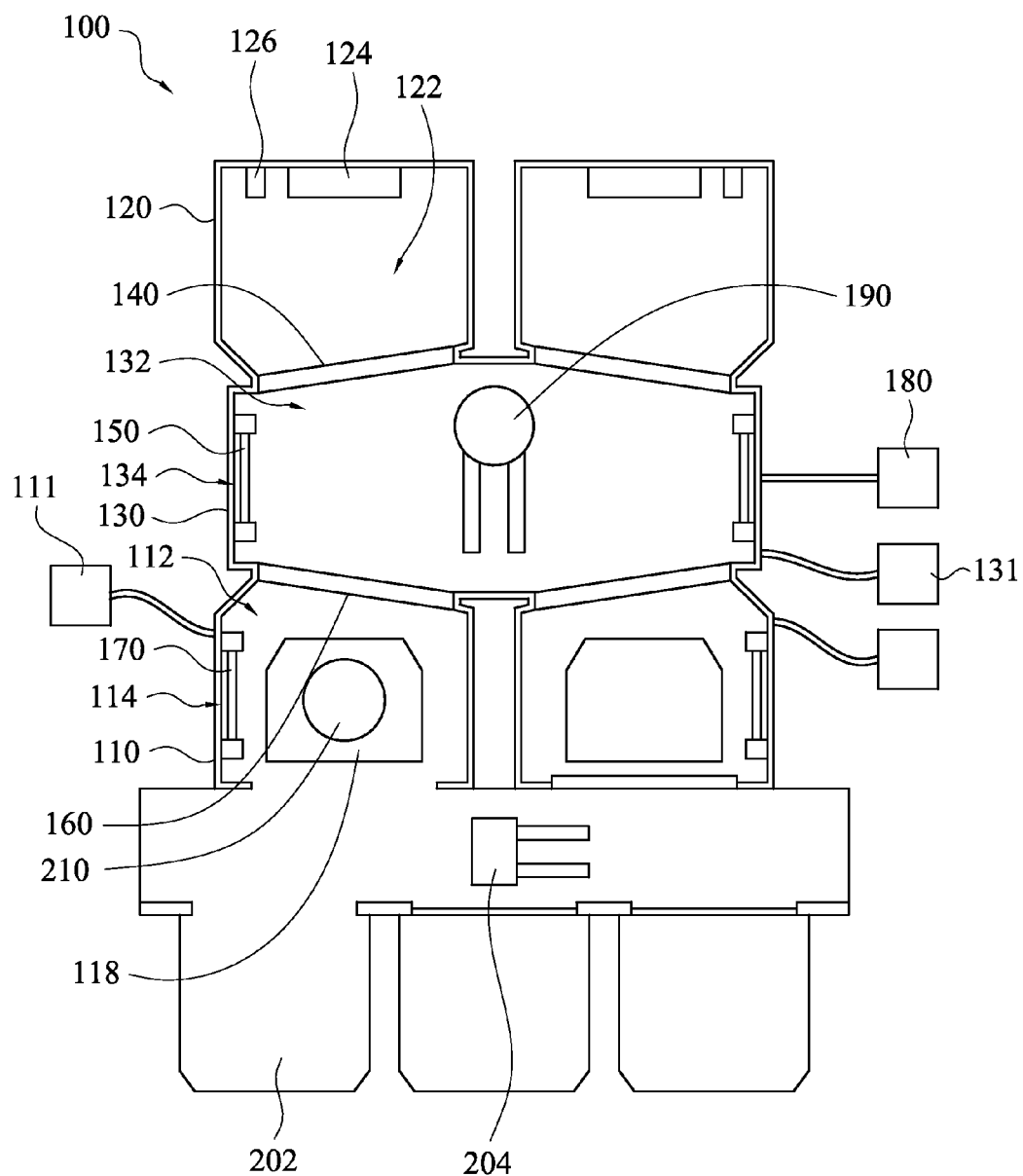
FIG. 4 is a schematic view of a last wafer shown in FIG. 3 after being moved to a load lock chamber.

FIG. 3 is a schematic view of a last wafer 210 backed in the process chamber 120 show in FIG. 1. FIG. 4 is a schematic view of the last wafer 210 shown in FIG. 3 after being moved to the load lock chamber 110. As shown in FIG. 3 and FIG. 4, the last wafer 210 is baked in the process chamber 120 to smooth the surface of the metal or oxide film thereof. After the baking process is finished, the first and second interior doors 160 may be opened. The transfer robot 190 attaches the last wafer 210 in the process chamber 120 and places the last wafer 210 in the load lock chamber 110. Afterwards, the second interior door 170 may be closed and the exterior door 116 may be opened.

In some embodiments, the last wafer 210 may be a thin slice of semiconductor material, such as a silicon crystal, used in the fabrication of integrated circuits and other micro devices. The last wafer 210 may serve as a substrate for microelectronic devices built thereon, and may undergo micro fabrication process steps, such as doping implantation, ion implantation, etching, CVD (chemical vapor deposition) of various materials, PVD (physical vapor deposition) of various materials, and photolithographic patterning.

Figure 5:
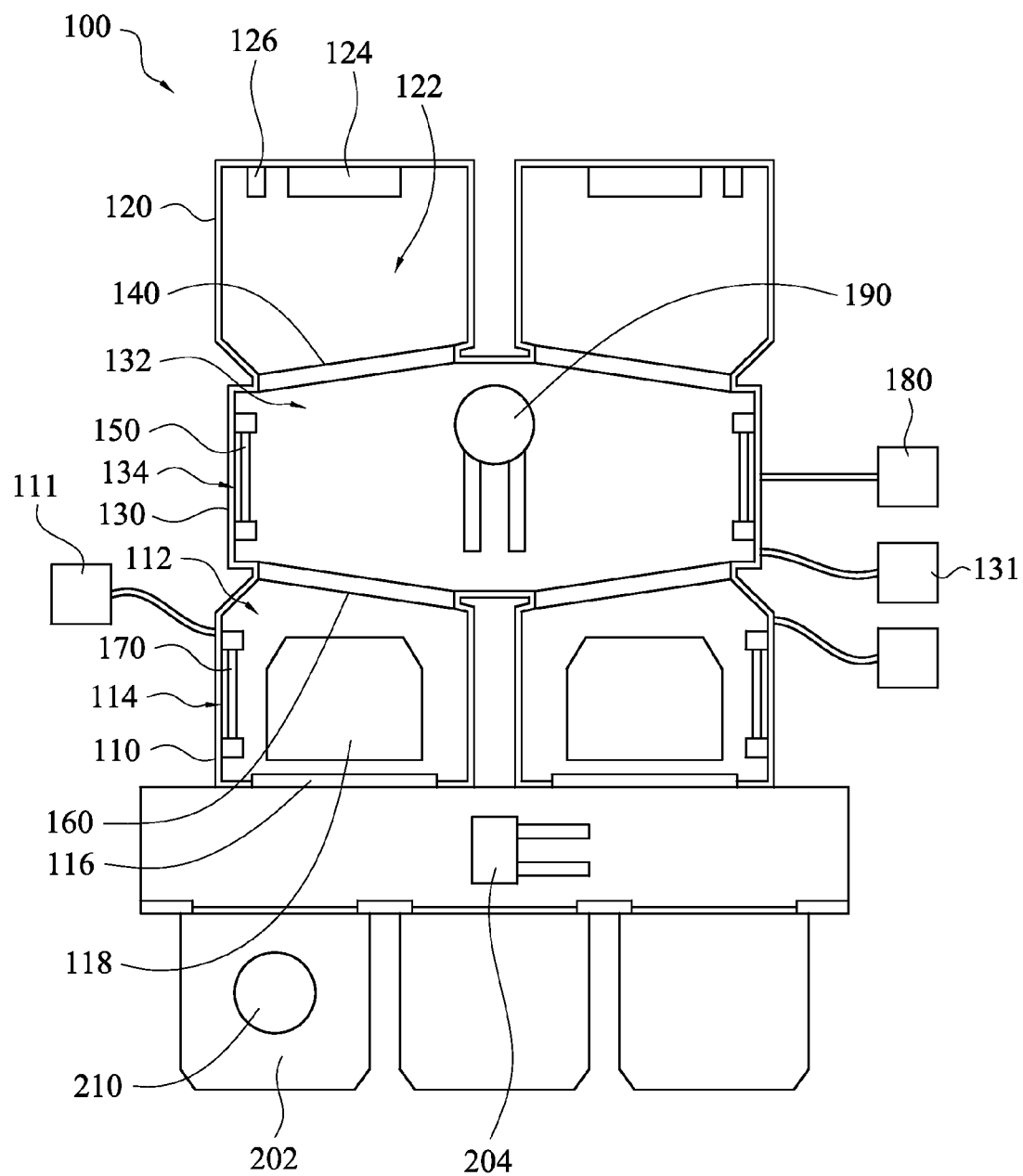
FIG. 5 is a schematic view of an exterior door after being closed.

FIG. 5 is a schematic view of the exterior door 116 after being closed. As shown in FIG. 4 and FIG. 5, the external robot 204 may move the last wafer 210 from the load lock chamber 110 to a wafer cassette that is on the cassette port 202, and the wafer cassette having the last wafer 210 may be moved to a stock station or the next process station. After the last wafer 210 is removed from the semiconductor baking apparatus 100, the exterior door 116 is closed and no wafer is moved into the semiconductor baking apparatus 100. The wafer lot having the last wafer 210 is moved out of the semiconductor baking apparatus 100. Thereafter, the exterior door 116, the first and second interior doors 140, 160 are closed, a load lock chamber base pressure inside the load lock chamber 110 and a transfer chamber base pressure inside the transfer chamber 130 may be pumped down after the wafer lot is moved out of the semiconductor baking apparatus 100 and before the next wafer lot is moved into the semiconductor baking apparatus 100.

Figure 6:
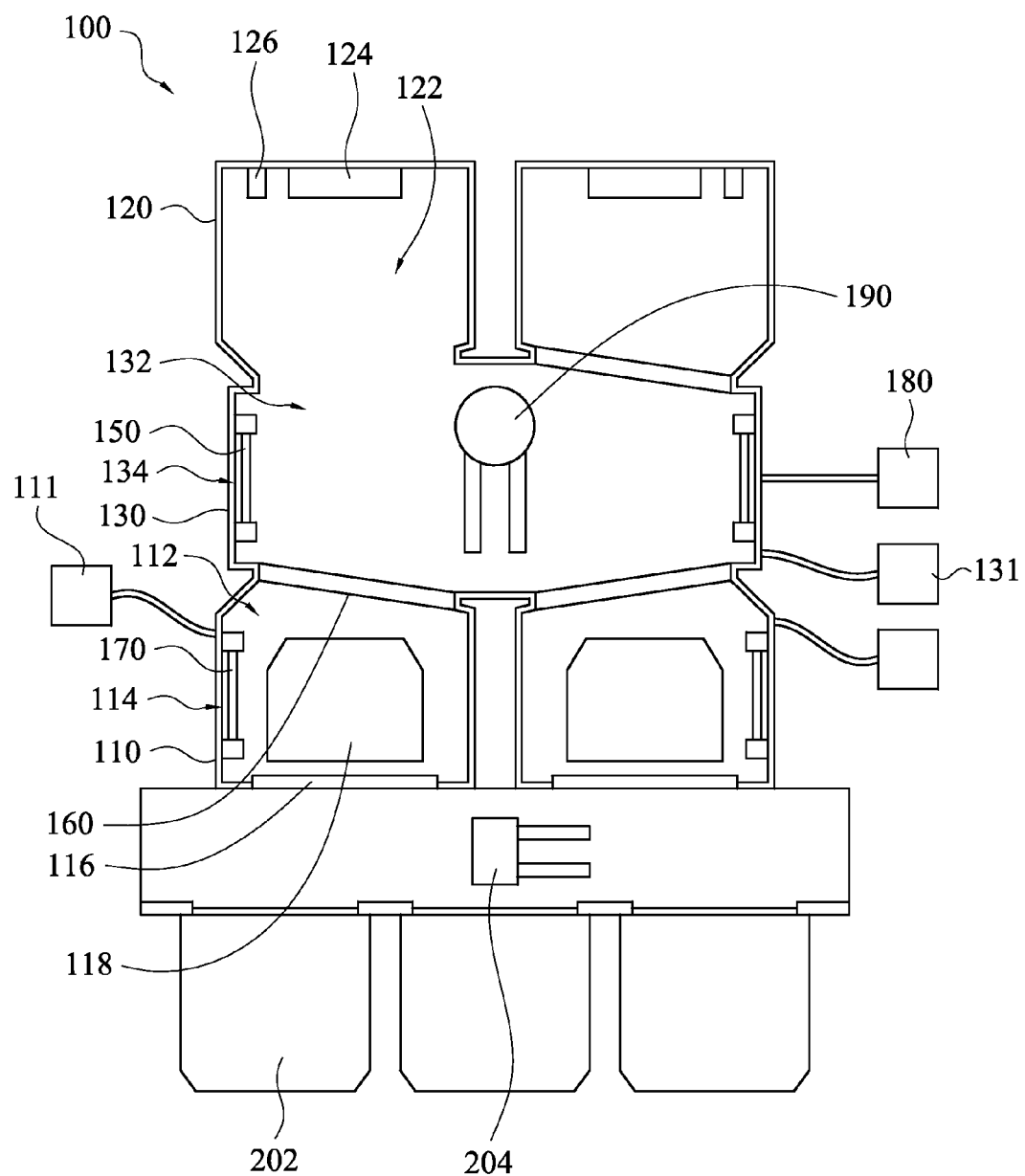
FIG. 6 is a schematic view of a first interior door shown in FIG. 5 after being opened.
Figure 7:
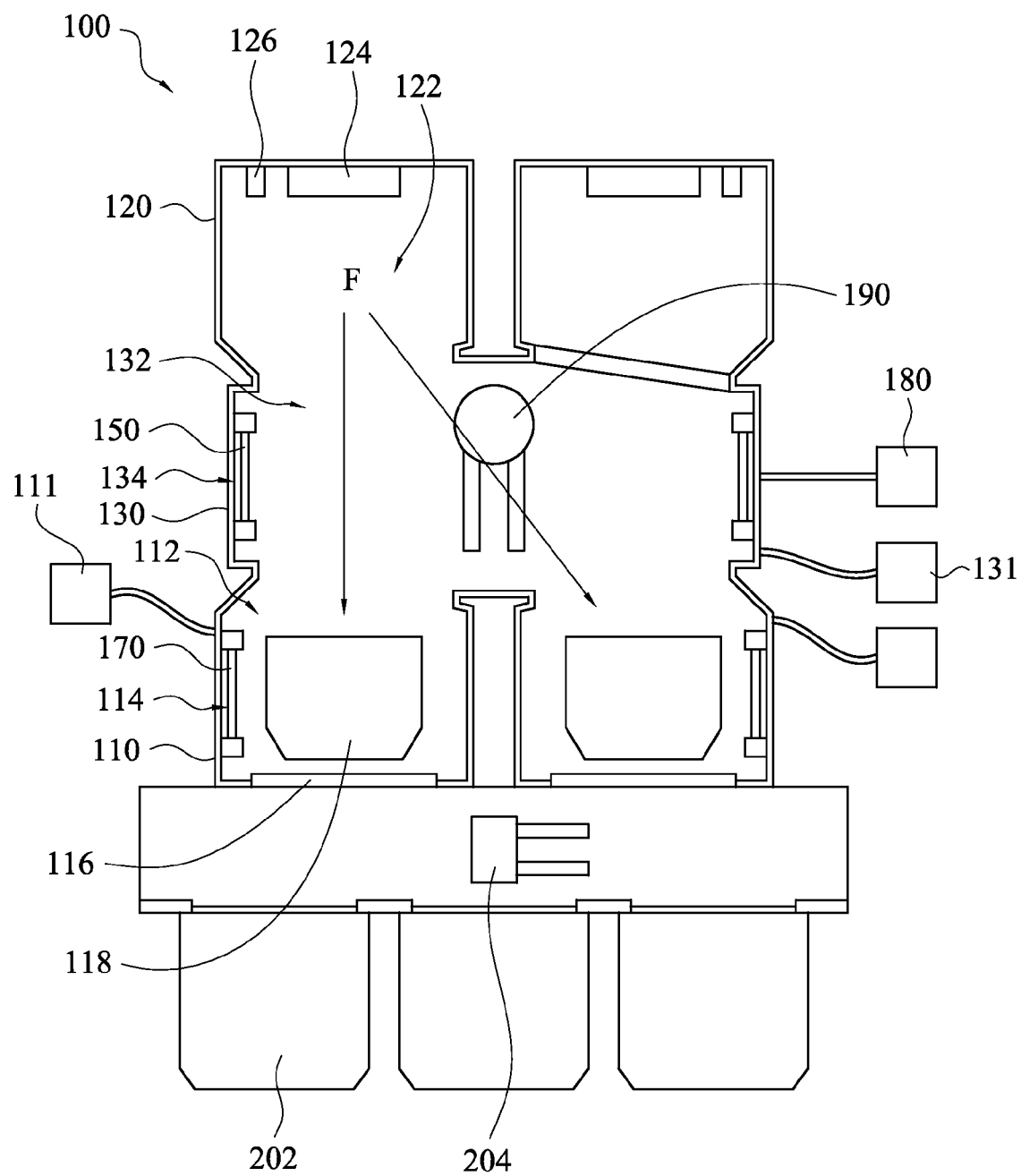
FIG. 7 is a schematic view of a second interior door shown in FIG. 6 after being opened.

FIG. 6 is a schematic view of the first interior door 140 shown in FIG. 5 after being opened. FIG. 7 is a schematic view of the second interior door 160 shown in FIG. 6 after being opened. As shown in FIG. 6 and FIG. 7, after the load lock chamber base pressure inside the load lock chamber 110 and the transfer chamber base pressure inside the transfer chamber 130 are pumped down, the first interior door 140 may be opened, and the second interior door 160 may also be opened. Heat for baking a wafer may be generated by the heater 124 of the process chamber 120. As a result, the heat transfers from the process chamber 120 to the transfer chamber 130 and the load lock chamber 110 after the wafer lot is moved out of the semiconductor baking apparatus 100 and before the next wafer lot is moved into the semiconductor baking apparatus 100. Therefore, the temperature inside the transfer chamber 130 and the temperature inside the load lock chamber 110 are raised, and the organic particles and/or steam in the transfer chamber 130 and the load lock chamber 110 are decreased. That is to say, the transfer chamber 130 and the load lock chamber 110 may keep a temperature (e.g., more than 150° C.) in a pre-heat state without cooling down before the next wafer moved into the semiconductor baking apparatus 100. When the next wafer is moved in the load lock chamber 110 and the transfer chamber 130, there will be fewer organic particles and/or steam attached onto the next wafer, thereby decreasing the bubble defects occurring after the later photolithography process.

Moreover, a gas flow F may flow out the gas inlet 126 of the process chamber 120, such that the gas flow F flows from the process chamber 120 to the transfer chamber 130 and the load lock chamber 110 after the wafer lot is moved out of the semiconductor baking apparatus 100 and before the next wafer lot is moved into the semiconductor baking apparatus 100. In this regard, the temperature inside the transfer chamber 130 and the temperature inside the load lock chamber 110 may be more uniform. The temperature difference and the heat gradient among the load lock chamber 110, the process chamber 120, and the transfer chamber 130 may be reduced. When the next wafer is moved in the load lock chamber 110 and the transfer chamber 130, the temperature of the metal or oxide film of the wafer will be uniform, such that the organic particles and/or the steam are not easily attached onto the metal or oxide film of the wafer. After the later photolithography process, the bubble defects formed on the metal or oxide film of the wafer will be decreased.

In some embodiments, after the wafer lot is moved out of the semiconductor baking apparatus 100 and before the next wafer lot is moved into the semiconductor baking apparatus 100, the transfer chamber 130 may be heated by turning on the first heating lamp 150 that is disposed in the transfer chamber 130, and the load lock chamber 110 may be heated by turning on the second heating lamp 170 that is disposed in the load lock chamber 110. As a result, the organic particles and/or the steam in the transfer chamber 130 and the load lock chamber 110 are further decreased due to the increased temperature inside the transfer chamber 130 and the increased temperature inside the load lock chamber 110.

Figure 8:
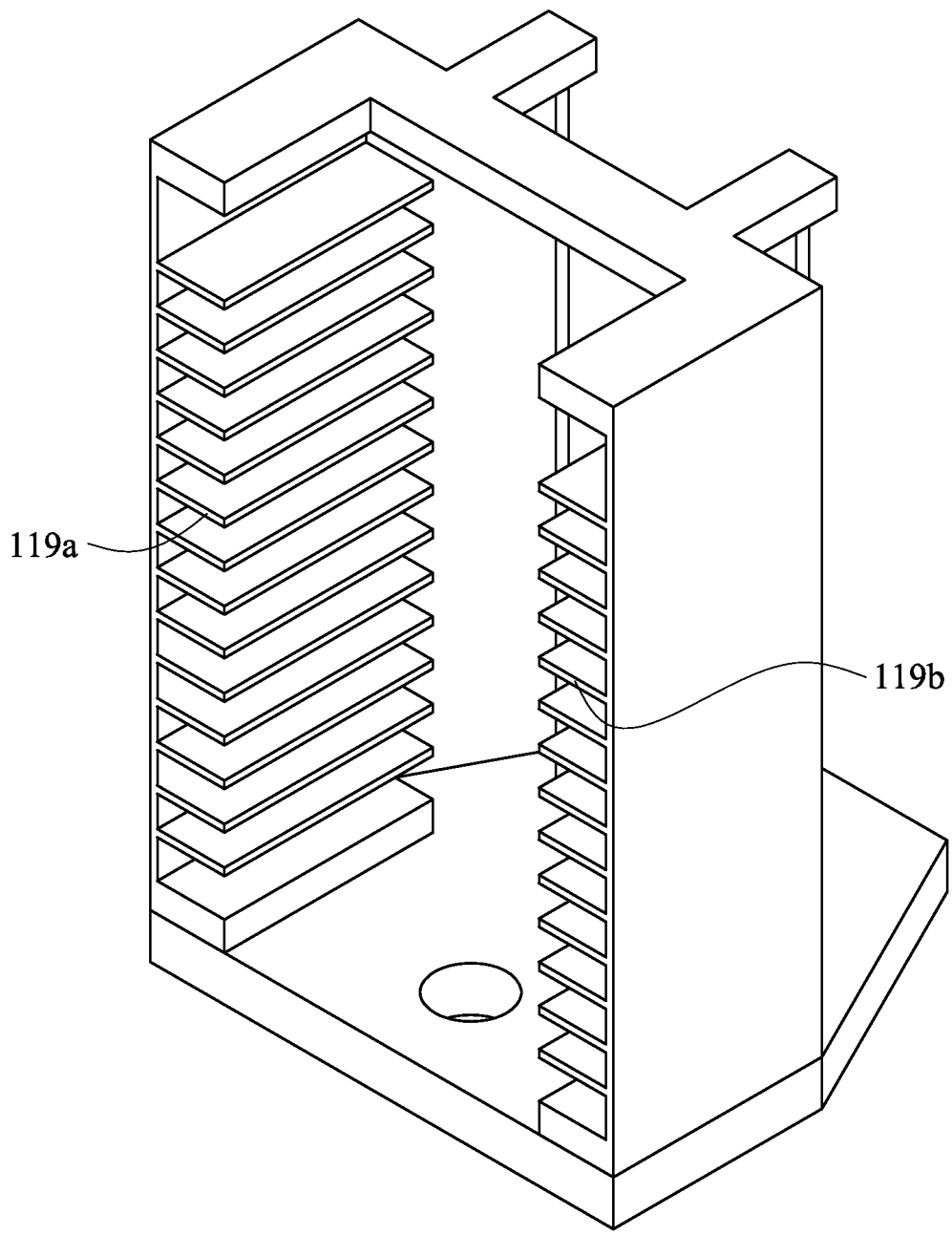
FIG. 8 is a perspective view of a load lock boat shown in FIG. 7.

FIG. 8 is a perspective view of a load lock boat 118 shown in FIG. 7. As shown in FIG. 7 and FIG. 8, the load lock boat 118 is disposed in the load lock chamber 110. The load lock boat 118 may be rotated in the load lock chamber 110. Two sides of the load lock boat 118 respectively have fingers 119a, 119b for supporting wafers, and the present disclosure is not limited by the number of the fingers 119a, 119b. After the load lock base pressure inside the load lock chamber 110 and the transfer chamber base pressure inside the transfer chamber 130 are pumped down, the first interior door 140 is opened, and the controller 180 may be programmed to turn the load lock boat 118, such that the fingers 119a, 119b face the process chamber 120 and the transfer chamber 130 when the semiconductor baking apparatus 100 idles. Thereafter, the second interior door 160 is opened. As a result, the fingers 119a, 119b of the load lock boat 118 is adjacent to the transfer chamber 130, such that heat may transfer to the fingers 119a, 119b thereby raising the temperatures of the fingers 119a, 119b. When two opposite edge regions of the next wafer respectively contact the fingers 119a, 119b, the temperatures of the two opposite edge regions of the next wafer will not be decreased, and the organic particles and/or the steam are not easily attached onto the metal or oxide film of the edge regions of the next wafer.

Figure 9:
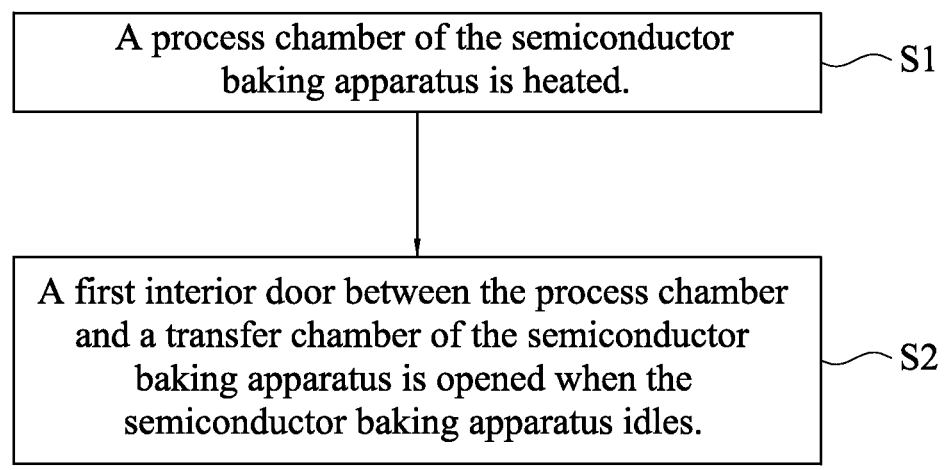
FIG. 9 is a flow chart of an operation method of a semiconductor baking apparatus according to some embodiments of the present disclosure.

FIG. 9 is a flow chart of an operation method of a semiconductor baking apparatus according to some embodiments of the present disclosure. The operation method of the semiconductor baking apparatus includes the following steps. In step S1, a process chamber of the semiconductor baking apparatus is heated. Thereafter in step S2, a first interior door between the process chamber and a transfer chamber of the semiconductor baking apparatus is opened when the semiconductor baking apparatus idles. In the following description, the aforementioned steps will be described in detail.

Figure 10:
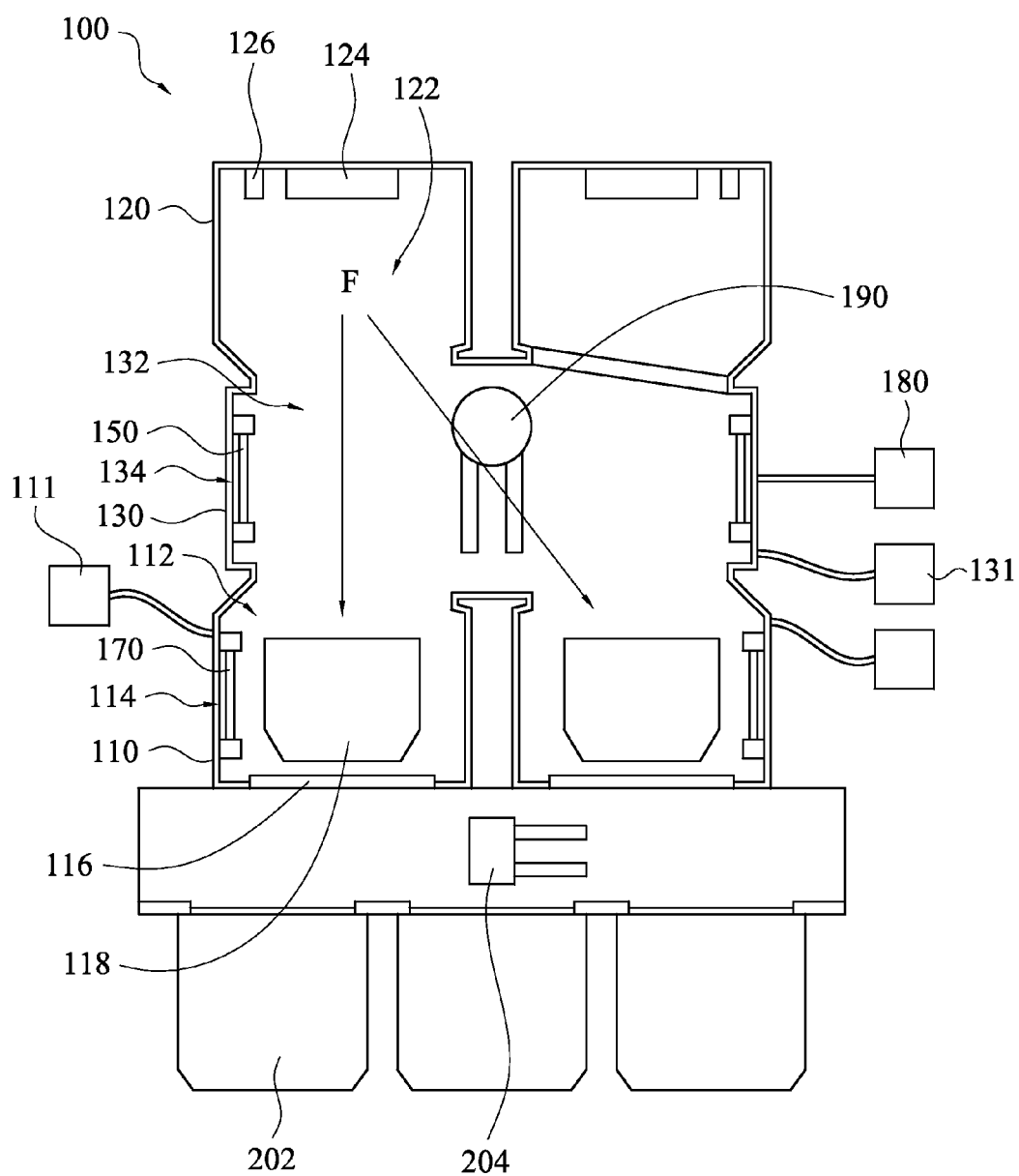
FIG. 10 is a schematic view of a semiconductor baking apparatus shown in FIG. 1 when being in a pre-heat state.

FIG. 10 is a schematic view of the semiconductor baking apparatus 100 shown in FIG. 1 when being in a pre-heat state. As shown in FIG. 1 and FIG. 10, after the last wafer is removed form the semiconductor baking apparatus 100, the semiconductor baking apparatus 100 idles and is in the pre-heat state (see FIG. 10). The process chamber 120 is heated by the heater 124. In some embodiments, when the semiconductor baking apparatus 100 idles, the first and second interior doors 140, 160 are opened to allow heat to transfer from the process chamber 120 to the transfer chamber 130 and the load lock chamber 110, and the first and second heating lamps 150, 170 are turned on to respectively increase the temperature inside the transfer chamber 130 and the temperature inside the load lock chamber 110. Therefore, the temperature inside the transfer chamber 130 and the temperature inside the load lock chamber 110 are increased.

In some embodiments, when the semiconductor baking apparatus 100 idles, the gas flow F may flow out the gas inlet 126, such that the gas flow F flows from the first accommodating space 122 to the second and third accommodating spaces 132, 112. The gas flow may bring the heat generated by the heater 124 to the transfer chamber 130 and the load lock chamber 110. As a result, the uniformity of the temperature inside the transfer chamber 130 and the uniformity of the temperature inside the load lock chamber 110 are improved.

Figure 11:
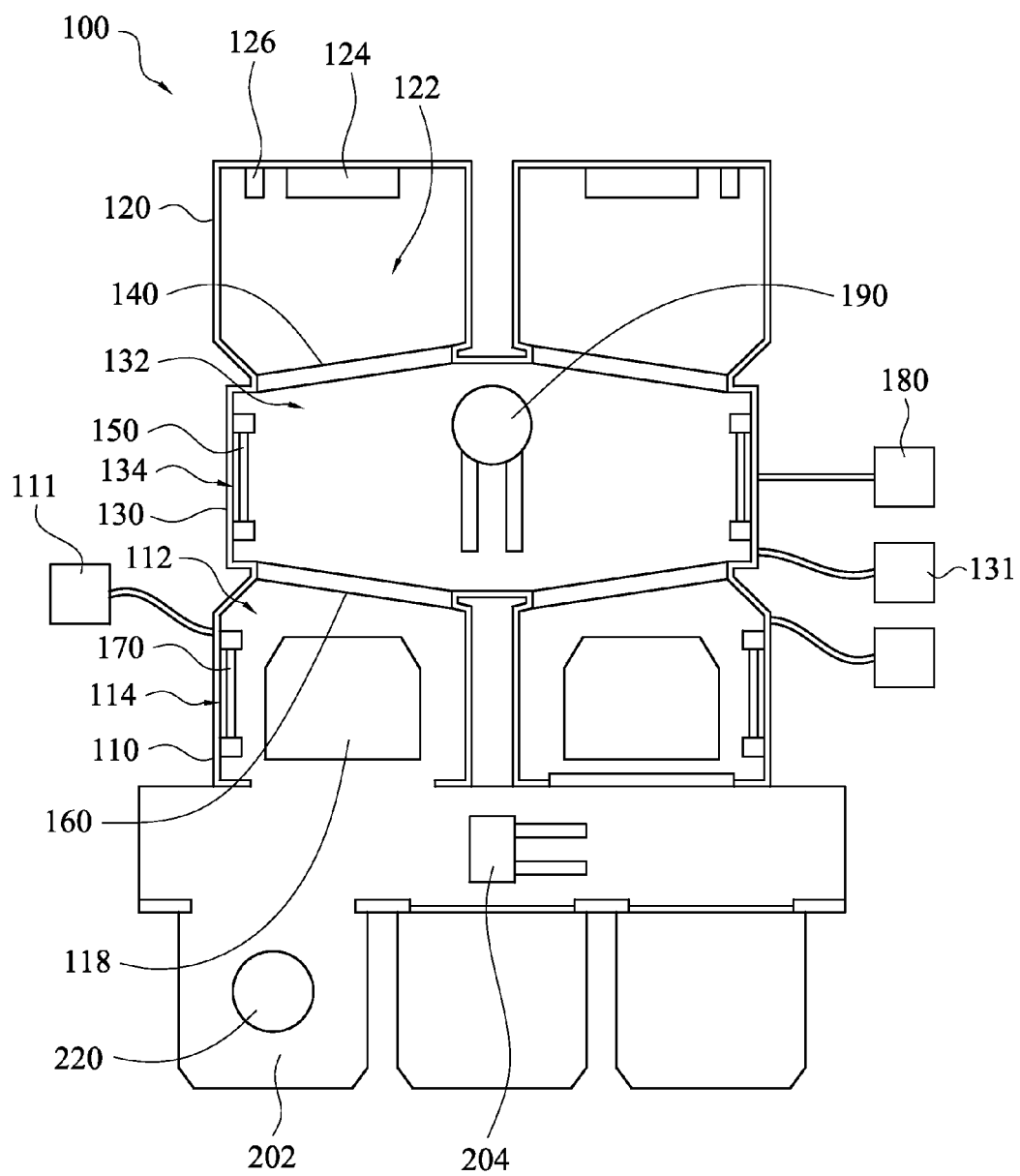
FIG. 11 is a schematic view of a first interior door and a second interior door after being closed.

FIG. 11 is a schematic view of the first interior door 140 and the second interior door 160 after being closed. As shown in FIG. 10 and FIG. 11, when the next wafer 220 of the next wafer lot is moved on the cassette port 202 to wait for the baking process of the semiconductor baking apparatus 100, the load lock boat 118 is turned to the exterior door 116, and the exterior door 116 is opened. The wafer 220 may be placed in the load lock chamber 110 by the external robot 204.

Figure 12:
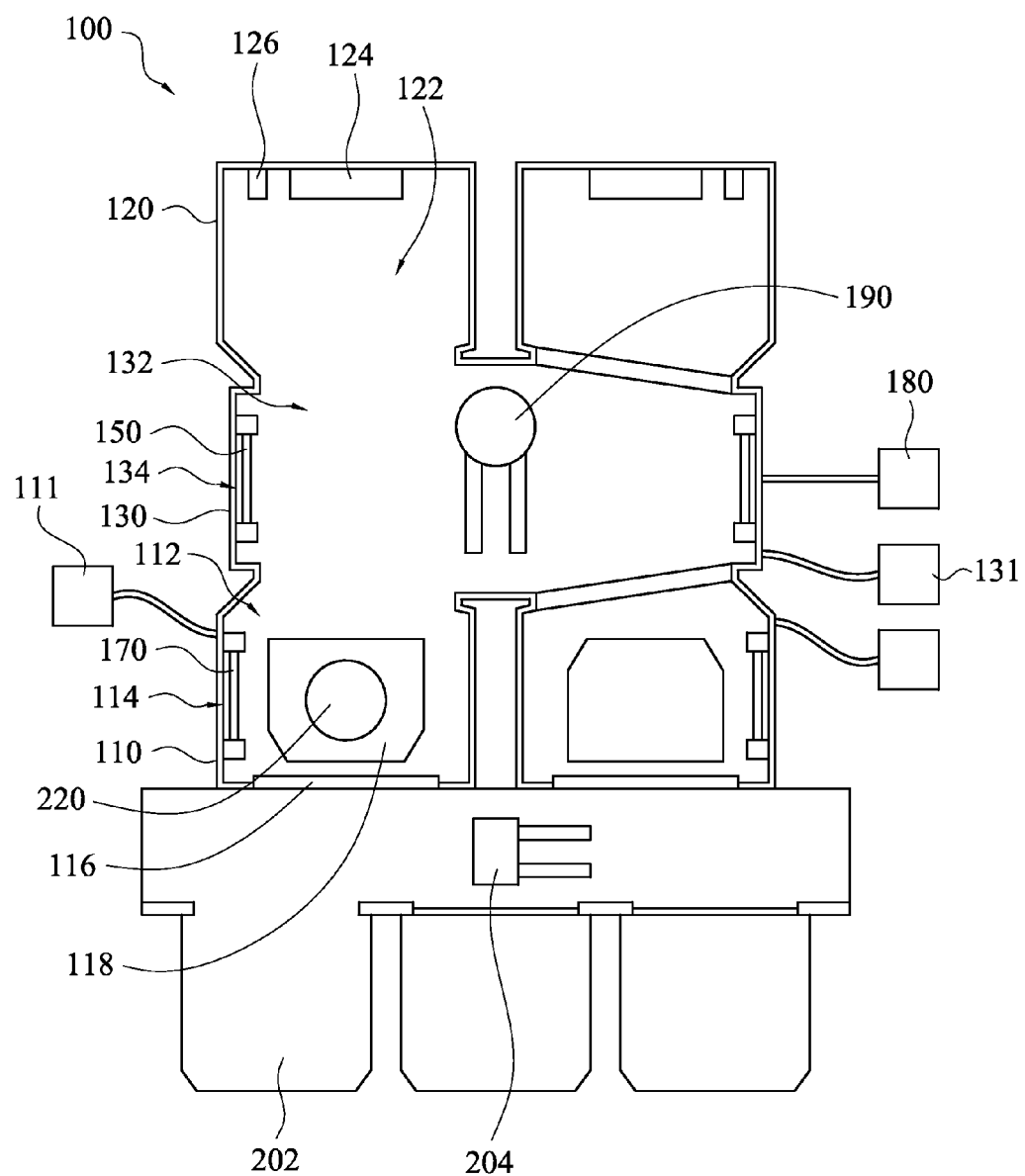
FIG. 12 is a schematic view of a wafer after being placed in a load lock chamber.

FIG. 12 is a schematic view of the wafer 220 after being placed in the load lock chamber 110. As shown in FIG. 11 and FIG. 12, after the wafer 220 is in the load lock chamber 110, the exterior door 116 is closed, and the first and second interior doors 140, 160 are opened. The wafer 220 may be transferred from the load lock chamber 110 to the process chamber 120 through the transfer chamber 130 by the transfer robot 190. Thereafter, the first interior door 140 may be closed, and the process chamber 120 performs the backing process on the wafer 220, as shown in FIG. 3. The following steps are the same as FIG. 3 to FIG. 7, so as not to be described repeatedly.

Through the pre-heat state of the load lock chamber 110 and the transfer chamber 130 shown in FIG. 10, the organic particles and/or the steam in the transfer chamber 130 and the load lock chamber 110 are decreased, and the temperature inside the transfer chamber 130 and the temperature inside the load lock chamber 110 are uniform. When the wafer 220 is moved in the transfer chamber 130 and the load lock chamber 110, the organic particles and/or the steam in the transfer chamber 130 and the load lock chamber 110 are not easily attached onto the metal or oxide film of the wafer. After the later photolithography process, the bubble defects formed on the metal or oxide film of the wafer will be decreased.

FIG. 13A is an $O_2$ AMU-Time relationship chart in the load lock chamber and the transfer chamber shown in FIG. 10. By using the operation method of the semiconductor baking apparatus and the semiconductor baking apparatus to bake a wafer, the count of $O_2$ is reduced to about $1\times10^{-10}$ AMU that is smaller than a conventional data (e.g., $2\times10^{-10}$ AMU).

Figure 13B:
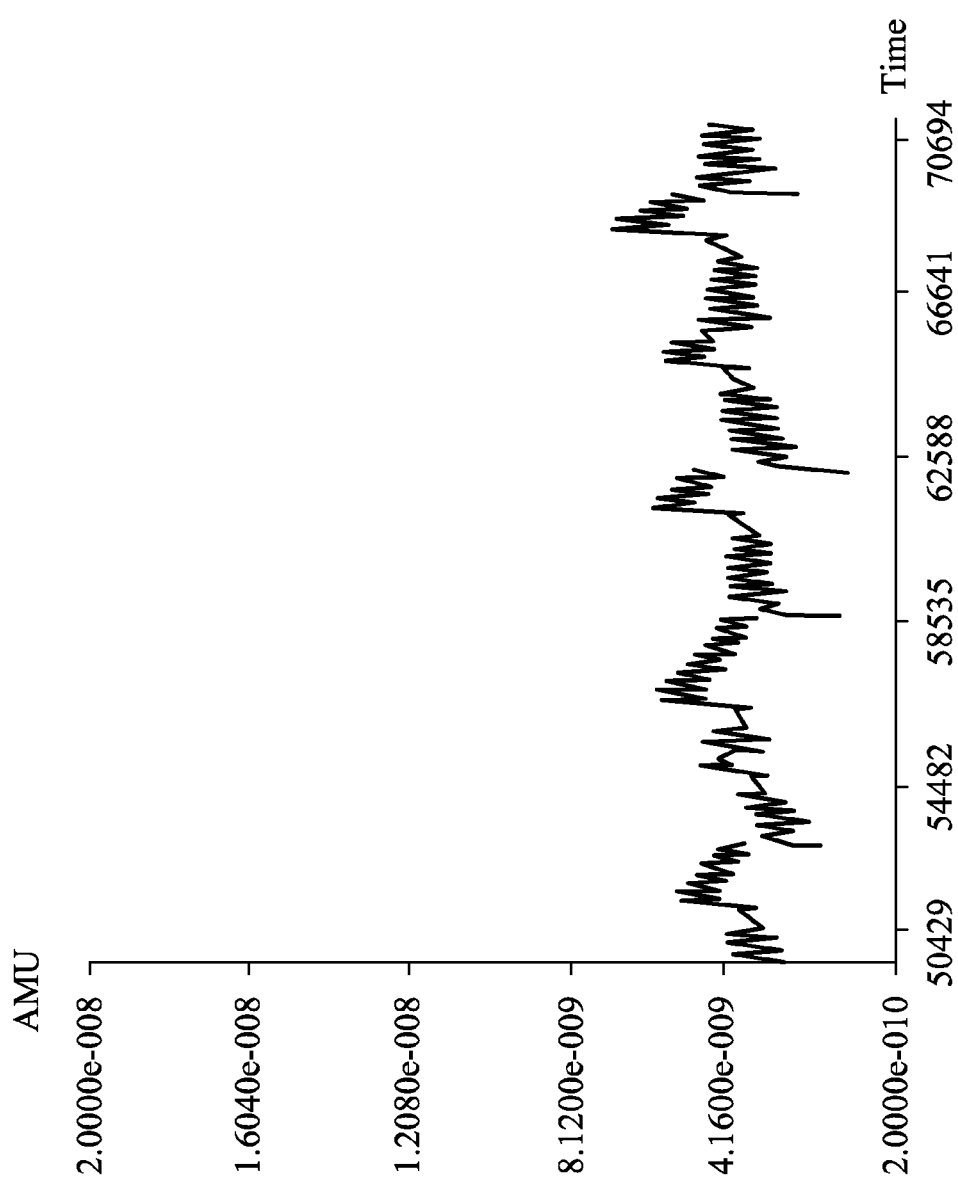
FIG. 13B is an $H_2O$ AMU-Time relationship chart in a load lock chamber and a transfer chamber shown in FIG. 10.

FIG. 13B is an $H_2O$ AMU-Time relationship chart in the load lock chamber and the transfer chamber shown in FIG. 10. By using the operation method of the semiconductor baking apparatus and the semiconductor baking apparatus of the present disclosure to bake a wafer, the count of $H_2O$ is reduced to about $0.4\times10^{-8}$ AMU that is smaller than a conventional data (e.g., $1.2\times10^{-8}$ AMU).

Figure 13C:
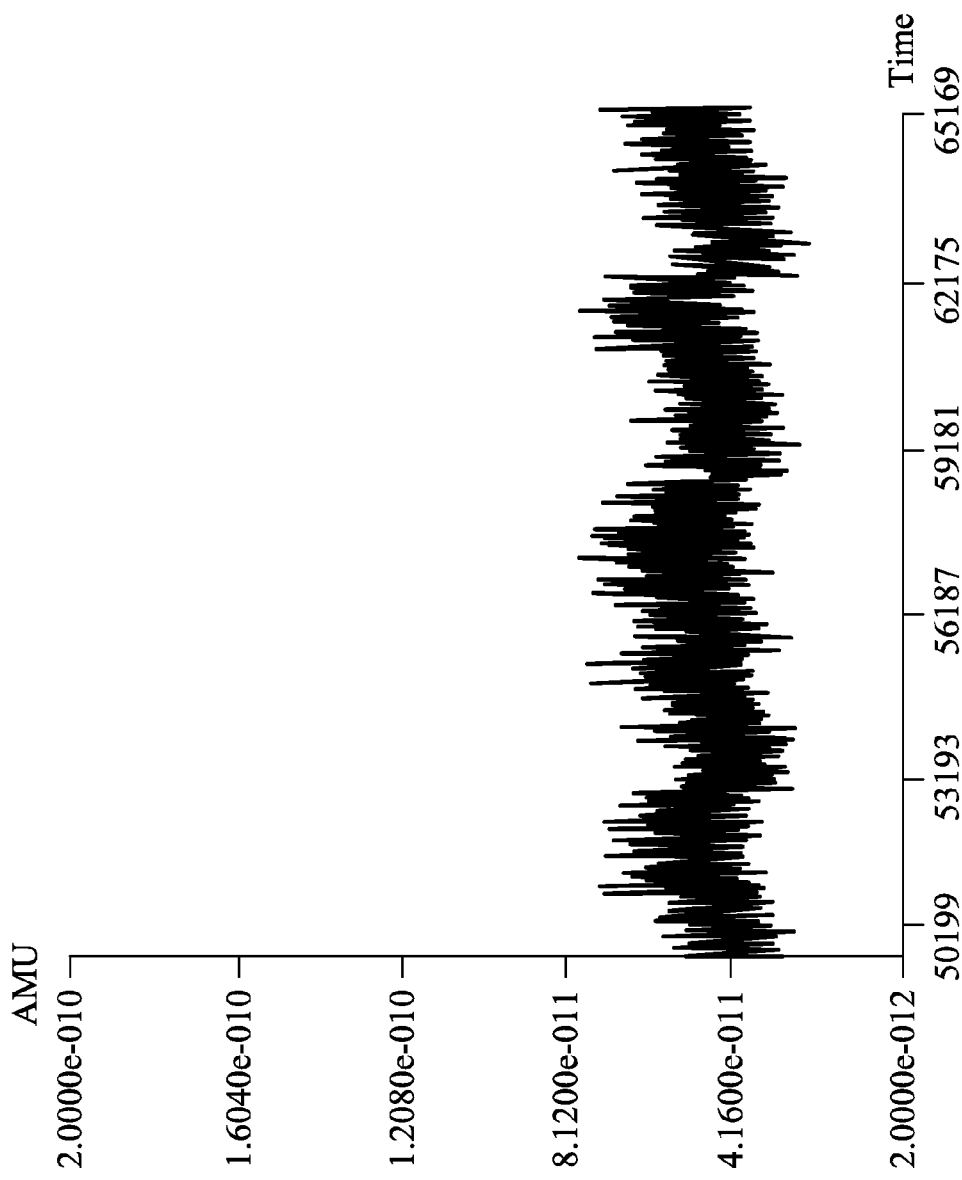
FIG. 13C is a C AMU-Time relationship chart in a load lock chamber and a transfer chamber shown in FIG. 10.

FIG. 13C is a C (carbon) AMU-Time relationship chart in the load lock chamber and the transfer chamber shown in FIG. 10. By using the operation method of the semiconductor baking apparatus and the semiconductor baking apparatus to bake a wafer, the count of C is reduced to about $5\times10^{-11}$ AMU that is smaller than a conventional data (e.g., $8.12\times10^{-11}$ AMU).

Therefore, the decrease of the organic particles and/or the steam in the transfer chamber and the load lock chamber of the present disclosure may be supported by the data of FIG. 13A to FIG. 13C.

Figure 14:
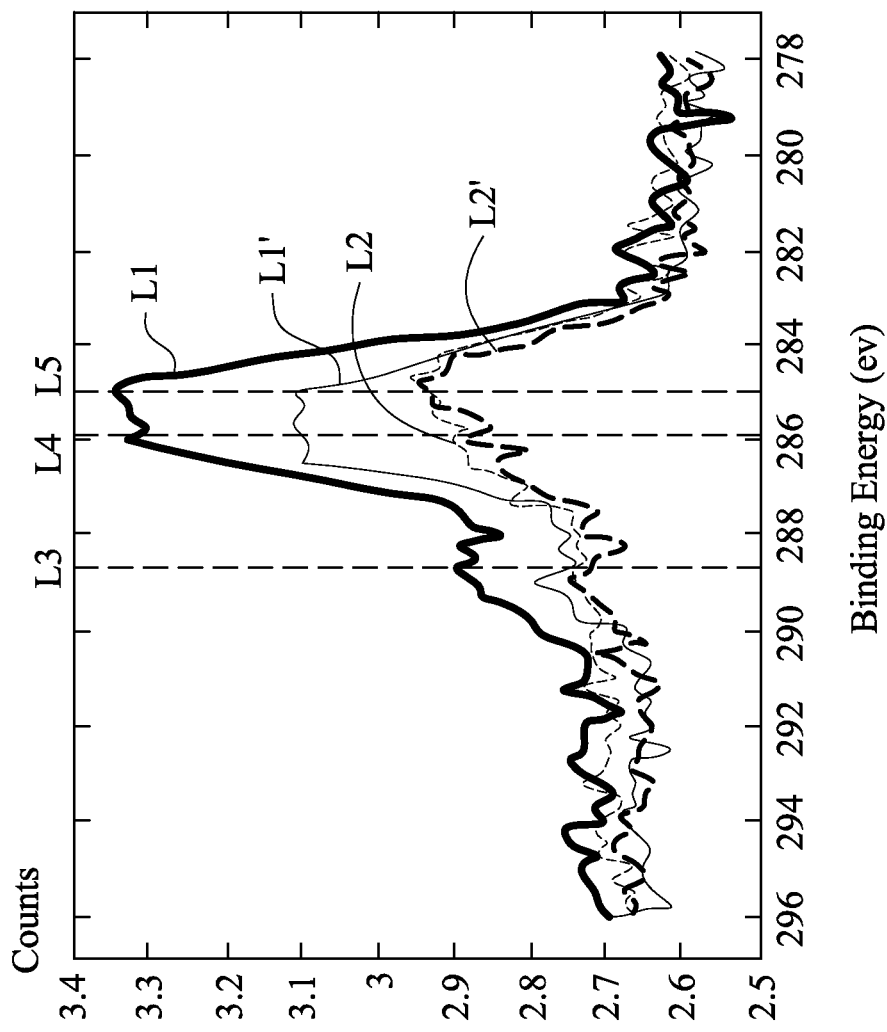
FIG. 14 is a Counts-Binding Energy relationship chart of two wafers after being baked.

FIG. 14 is a Counts-Binding Energy relationship chart of two wafers after being baked. After a baking process is performed on a wafer by using the operation method of the semiconductor baking apparatus and the semiconductor baking apparatus of the present disclosure, a x-ray photoelectron spectroscopy (XPS) device may be analyze the metal or oxide film of the wafer. Line L2 and Line L2' are referred to as particle counts of two edge regions of the wafer baked by using the semiconductor baking apparatus and the operation method of the present disclosure, and line L1 and line L1' are referred to as particle counts of two edge regions of another wafer baked by using a conventional baking apparatus. Line L3 is referred to as C=O particles, line L4 is referred to as C—O particles, and line L5 is referred to as C≡C and/or C—H particles. According to the data shown in FIG. 14, the intersection points of line L2 (or line L2') and line L3 are smaller than the intersection points of line L1 (or line L1') and line L3, the intersection points of line L2 (or line L2') and line L4 are smaller than the intersection points of line L1 (or line L1') and line L4, and the intersection points of line L2 (or line L2') and line L5 are smaller than the intersection points of line L1 (or line L1') and line L5. Therefore, after the photolithography process, the bubble defects formed on the metal or oxide film of the baked wafer through the operation method of the semiconductor baking apparatus and the semiconductor baking apparatus of the present disclosure are decreased.

In order to prevent organic particles and/or steam from attaching onto a wafer during a backing process, a semiconductor baking apparatus and a manufacturing method thereof for decreasing the organic particles and/or the steam are designed to reduce bubble defects formed on the metal or oxide film of the wafer after a photolithography process. When the semiconductor baking apparatus idles, a first interior door between a process chamber and a transfer chamber of the semiconductor baking apparatus are opened to allow heat to transfer from the process chamber to the transfer chamber, thereby raising the temperature inside the transfer chamber. When the wafer is moved in the transfer chamber, there will be fewer organic particles and/or steam attached onto the wafer.

According to some embodiments, a semiconductor baking apparatus is provided. The semiconductor baking apparatus includes a load lock chamber, a process chamber, a transfer chamber, a first interior door, and a controller. The process chamber has a first accommodating space therein. The transfer chamber has a second accommodating space therein, and the transfer chamber is connected to the load lock chamber and the process chamber. The first interior door is between the process chamber and the transfer chamber. When the first interior door is opened, the first accommodating space is communicated with the second accommodating space. The controller is programmed to open the first interior door when the semiconductor baking apparatus idles.

According to some embodiments, an operation method of a semiconductor baking apparatus is provided. The operation method of the semiconductor baking apparatus includes the following steps. A wafer lot is moved out of the semiconductor baking apparatus, and the semiconductor baking apparatus includes a process chamber, a transfer chamber connected to the process chamber, and a first interior door between the process chamber and the transfer chamber. The first interior door is opened, such that heat transfers from the process chamber to the transfer chamber after the wafer lot is moved out of the semiconductor baking apparatus and before the next wafer lot is moved into the semiconductor baking apparatus.

According to some embodiments, an operation method of a semiconductor baking apparatus is provided. The operation method of the semiconductor baking apparatus includes the following steps. A process chamber of the semiconductor baking apparatus is heated. A first interior door between the process chamber and a transfer chamber of the semiconductor baking apparatus is opened when the semiconductor baking apparatus idles.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor baking apparatus comprising:
   a load lock chamber;
   a process chamber having a first accommodating space therein;
   a transfer chamber having a second accommodating space therein and connected to the load lock chamber and the process chamber;
   a first interior door between the process chamber and the transfer chamber, wherein when the first interior door is opened, the first accommodating space is communicated with the second accommodating space; and
   a controller programmed to open the first interior door when the semiconductor baking apparatus idles.

2. The semiconductor baking apparatus of claim 1, further comprising:

a first heating lamp disposed in the second accommodating space.

3. The semiconductor baking apparatus of claim 2, wherein the controller is further programmed to turn on the first heating lamp when the semiconductor baking apparatus idles.

4. The semiconductor baking apparatus of claim 2, wherein the load lock chamber has a third accommodating space therein;
the semiconductor baking apparatus further comprising:
a second interior door between the load lock chamber and the transfer chamber, wherein when the second interior door is opened, the third accommodating space is communicated with the second accommodating space; and
wherein the controller is further programmed to open the second interior door when the semiconductor baking apparatus idles.

5. The semiconductor baking apparatus of claim 4, further comprising:
a second heating lamp disposed in the third accommodating space.

6. The semiconductor baking apparatus of claim 5, wherein the controller is further programmed to turn on the second heating lamp when the semiconductor baking apparatus idles.

7. The semiconductor baking apparatus of claim 1, further comprising:
a transfer chamber pump operable to pump down a transfer chamber base pressure inside the transfer chamber when the semiconductor baking apparatus idles.

8. The semiconductor baking apparatus of claim 4, further comprising:
a load lock chamber pump operable to pump down a load lock chamber base pressure inside the load lock chamber when the semiconductor baking apparatus idles.

9. The semiconductor baking apparatus of claim 1, further comprising:
a load lock boat disposed in the load lock chamber and having a plurality of fingers;
wherein the controller is further programmed to turn the load lock boat such that the fingers face the process chamber when the semiconductor baking apparatus idles.

10. The semiconductor baking apparatus of claim 1, wherein the transfer chamber comprises:
a transfer robot disposed in the second accommodating space.

11. The semiconductor baking apparatus of claim 1, wherein the process chamber further comprises:
a gas inlet communicated with the first accommodating space.

12. The semiconductor baking apparatus of claim 4, wherein the transfer chamber has a sidewall adjacent to the first and second interior doors, and the first heating lamp is disposed on the sidewall of the transfer chamber.

13. The semiconductor baking apparatus of claim 5, wherein the load lock chamber further comprises:
an exterior door opposite to the second interior door.

14. The semiconductor baking apparatus of claim 13, wherein the load lock chamber has a sidewall adjacent to the exterior door and the second interior door, and the second heating lamp is disposed on the sidewall of the load lock chamber.

15. The semiconductor baking apparatus of claim 7, wherein the transfer chamber pump is communicated with the second accommodating space.

16. The semiconductor baking apparatus of claim 8, wherein the load lock chamber pump is communicated with the third accommodating space.

17. The semiconductor baking apparatus of claim 11, wherein the process chamber has a sidewall opposite to the first interior door, and the gas inlet is disposed on the sidewall of the process chamber.

18. The semiconductor baking apparatus of claim 17, wherein the process chamber further comprises:
a heater disposed in the first accommodating space.

19. The semiconductor baking apparatus of claim 18, wherein the heater is disposed on the sidewall of the process chamber.

20. The semiconductor baking apparatus of claim 18, wherein the heater is adjacent to the gas inlet.

* * * * *